United States Patent [19]

Bernays, Jr.

[11] Patent Number: 4,495,460
[45] Date of Patent: Jan. 22, 1985

[54] RESETTABLE FEEDBACK SENSOR

[75] Inventor: David J. Bernays, Jr., San Jose, Calif.

[73] Assignee: The Charles Stark Draper Laboratory, Inc., Cambridge, Mass.

[21] Appl. No.: 387,161

[22] Filed: Jun. 10, 1982

[51] Int. Cl.$^3$ .............................................. G01R 23/16
[52] U.S. Cl. .................. 324/77 A; 318/141; 322/17; 322/20
[58] Field of Search .................. 324/78 Z, 78 E, 78 S, 324/77 A, 79 D, 76 A, 78 D, 78 R, 99 D; 318/141; 322/17, 18, 19, 20, 21, 22; 340/347 NT

[56] References Cited

U.S. PATENT DOCUMENTS

| | | | |
|---|---|---|---|
| 3,579,105 | 5/1971 | Scott | 324/99 D |
| 3,590,277 | 6/1971 | South | 324/78 E |
| 3,656,048 | 4/1972 | Hauf | 322/19 |
| 3,662,377 | 5/1972 | Dym et al. | 324/99 D |
| 3,665,305 | 5/1972 | Petrohilos | 324/99 D |
| 3,727,074 | 4/1973 | Keller et al. | 324/76 A |
| 3,849,775 | 11/1974 | Buchanan et al. | 340/347 NT |
| 3,895,376 | 7/1975 | Uchida | 324/99 D |
| 3,968,431 | 7/1976 | Ekstrom | 324/78 E |
| 4,031,440 | 6/1977 | Christian et al. | 318/141 |
| 4,356,440 | 10/1982 | Curtiss et al. | 322/20 |

Primary Examiner—Stewart J. Levy
Attorney, Agent, or Firm—Kenway & Jenney

[57] ABSTRACT

This invention is directed to a digital feedback control system. The control system includes a controlled device which generates an output signal representative of the operation of that device, with that output signal being a relatively high frequency carrier signal having a relatively slowly varying (compared to the carrier signal) envelope. The control system further includes a difference network for generating an error signal representative of the difference between an input command signal and a sensor signal derived from the output signal of the controlled device. A feedback network is responsive to the output signal to provide the sensor signal. The feedback network includes a selectively operative integrator which generates an integrated signal representative of the integral of the output signal. The feedback system further includes a selectively operable network for resetting the integrator. A selectively operable analog-to-digital (A/D) converter is adapted to generate a digital signal representative of the integrated signal. A controller is operative during each cycle of the carrier signal to sequentially enable the integrator during a predetermined portion of each cycle, followed by enabling the A/D converter and finally enabling the reset network.

2 Claims, 4 Drawing Figures

RESETTABLE FEEDBACK SENSOR

REFERENCE TO RELATED APPLICATIONS

The present application is related to U.S. patent application Ser. No. 188,306, filed on Sept. 18, 1980, now U.S. Pat. No. 4,417,194 entitled "Induction Generator System With Switched Capacitor Control". That application is incorporated herein by reference.

BACKGROUND OF THE DISCLOSURE

The present invention is in the field of control systems, and more particularly, digital feedback control systems.

There are many systems in the prior art which include a device-to-be-controlled embedded in a digital feedback loop, where that device may provide an output signal representative of its operation. Typically, the output signal is coupled by way of a feedback network to a difference network which provides an error signal to drive the device-to-be-controlled. The error signal is generally representative of the difference between an input command signal and the feedback signal provided by the feedback network. By way of example, where the device to be controlled is an induction generator, the output signal may be a relatively high frequency carrier voltage signal having a relatively slowly varying envelope. In an amplitude control loop configuration, the feedback network includes a sensor network responsive to the output signal which provides a feedback signal representative of that output signal. In various configurations, the error signal may be applied to the device-to-be-controlled by way of a compensation device or network which modifies the loop transmission characteristics in such a way to maintain stable loop operation. Various portions of the system may be preformed digitally with the use of suitable analog-to-digital (A/D) and digital-to-analog (D/A) conversion techniques. For example, a microprocessor network may be used to perform the difference network function.

In many cases, it is necessary to include a filter (usually lowpass in nature) in the feedback path to remove high frequency noise from the feedback signal. Various implementations of filters are known, varying from pure integrators, to multiple low, or bandpass filters. All of these networks are characterized by frequency responses with reduced gain at high frequencies relative to low frequencies. As a consequence, the output from the feedback network is generally a weighted average of past inputs. Thus, the feedback network may be considered to maintain a certain amount of memory. Because of this "memory", the feedback network generally introduces a phase lag to the control loop. This lag can de-stabilize a system, particularly during large signal operation. Furthermore, the response of the feedback network does not track the system output instantaneously, thereby degrading transient performance of the loop.

Moreover, in many configurations, the feedback network must be of relatively high quality in a precision loop in order to prevent limitations in loop accuracy due to drift. Prior art automatic correction techniques are known to correct for long-term drift. However, such techniques are relatively expensive, and depend on the feedback network maintaining substantially constant performance at least for times short compared with the loop memory. Moreover, as filtering is added to reduce drift, the loop memory increases, resulting in more critical specifications for the feedback network.

It is an object of the present invention to provide an improved digital feedback control system.

A further object is to provide an improved digital feedback control system which minimizes phase delay to the loop.

Yet another object is to provide an improved sensing system with substantially no memory, thereby permitting relaxed drift requirements and increased response speed.

SUMMARY OF THE INVENTION

Briefly, the present invention is directed to a digital feedback control system. The control system includes a controlled device (such as an induction generator) which generates an output signal representative of the operation of that device, with that output signal being a relatively high frequency carrier signal having a relatively slowly varying (compared to the carrier signal) envelope. The control system further includes a difference network for generating an error signal representative of the difference between an input command signal and a sensor signal derived from the output signal of the controlled device.

A feedback network is responsive to the envelope of the output signal to provide the sensor signal. The feedback network includes a selectively operative integrator which generates an integrated signal representative of the integral of the output signal. The feedback system further includes a selectively operable network for resetting the integrator. A selectively operable analog-to-digital (A/D) converter is adapted to generate a digital signal representative of the integrated signal. A controller is operative during each cycle of the carrier signal to sequentially enable the integrator during a predetermined portion of each cycle, followed by enabling the A/D converter and finally enabling the reset network. In this manner, the digital signal becomes representative of the average amplitude of the carrier signal during each cycle. In the case where the integrator is operative during the first half of the carrier cycle, more particularly, the value represented by the digital signal from the feedback network is proportional to the amplitude of the output signal during the predetermined portion of each cycle divided by the frequency of that output signal. Because the sensor is reset on a cycle-to-cycle basis, there is no phase delay such as that associated with a first order integrator.

In operation, the resettable integrator senses the output signal produced by the device being controlled. In the exemplary case, where that device is an induction generator operating at a nominal "relatively high", system frequency of 60 Hertz, the controller also cycles at the 60 Hertz rate. That is, during each cycle of the output signal (e.g. voltage) of the induction generator, the integrator which had been reset to zero during the previous cycle, integrates the output signal for a predetermined portion of the cycle; that is, the A/D converter is synchronized to the carrier signal. The resultant voltage is held while the A/D converter is operative to perform an analog-to-digital conversion. Generally, this conversion occurs during an interval short compared to the period of the carrier signal. Finally, the integrator is reset in preparation for the next cycle. In this manner, the feedback network generates a filtered version of the envelope of the generator output voltage, sampled during a finite window synchronized to the carrier signal. The feedback network provides adequate filtering to reject noise spikes due to switched loads, yet is fast enough to allow control of the system on a cycle-to-cycle basis. Because the integrator is reset during each cycle, it has no cycle-to-cycle memory, and thus no phase lag is added to the digital control loop. Further, the gain of the filter is only required to be stable for periods of time comparable to the sampling window, which can be quite short.

BRIEF DESCRIPTION OF THE DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENT

Figure 1:
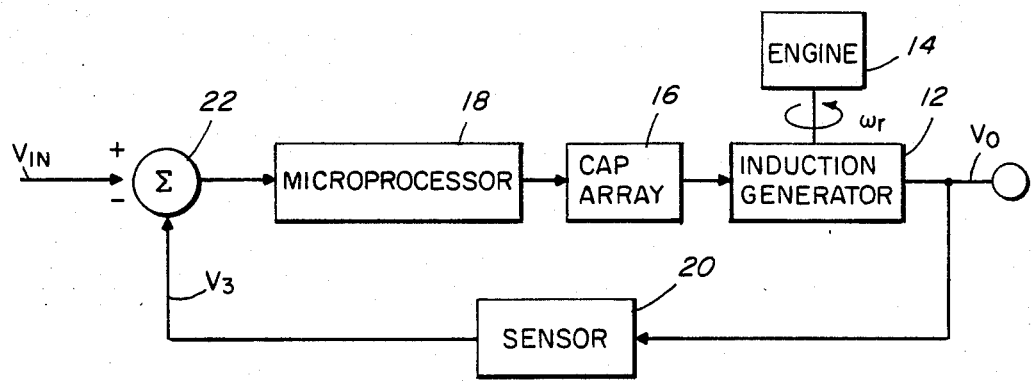
FIG. 1 shows in block diagram form an exemplary feedback control system embodying the present invention.

FIG. 1 shows an exemplary feedback control system 10 embodying the present invention. The embodiment of FIG. 1 illustrates a single phase induction generation system, having active control at the capacitance attached across the generator terminals, to regulate the output voltage. The array of capacitors is connected in parallel with the load through electronic switches. More or less capacitance is connected as necessary to supply magnetizing and reactive load current. The present system updates the capacitance array once per cycle (at a zero crossing of current) and thus reduces switching transients and provides changes in capacitance at intervals which are short relative to the rotor time constant. Consequently, forced commutation is not required. The invention may also be used in conjunction with devices other than induction generators.

More particularly, system 10 includes an induction generator 12 embedded in an amplitude control loop. The induction generator 12 is coupled to an associated internal combustion engine 14 used as the prime mover. In the present embodiment, the generator 12 is a single phase induction machine. The system 10 further includes a capacitive array 16 coupled to generator 12. The array 16 is controlled by microprocessor 18 to adaptively couple selectively determined capacitors across the terminals of generator 12 to provide reactive power in order to support the air gap flux in generator 12. An analog-to-digital sensor 20 detects the output voltage ($V_o$) from the induction generator 12. The feedback signal from sensor 20 is combined with an input command signal ($V_{IN}$) in a summing network 22 to produce an error signal. The error signal applied to microprocessor 18 which in turn generates control signals for controlling the capacitive array 18 to couple appropriate capacitors across the terminals of generator 12. In FIG. 1, the summing network 22 is shown to be outside microprocessor 18 for simplicity. In the preferred form, the combining of the feedback signal $V_s$ and input command signal $V_{IN}$ is performed by microprocessor 18.

In this configuration, the amplitude control loop operates in a closed loop manner to control the optimum capacitance to be coupled across the induction generator terminals so that the magnetizing inductance is nulled by the terminal capacitance on a cycle-to-cycle basis. Since the magnetizing current is then supplied by the capacitors, the power factor of the machine as seen from the load terminals is adjusted to be unity. The incorporated reference discloses a specific configuration for an induction generator utilizing capacitor array switching.

Figure 2:
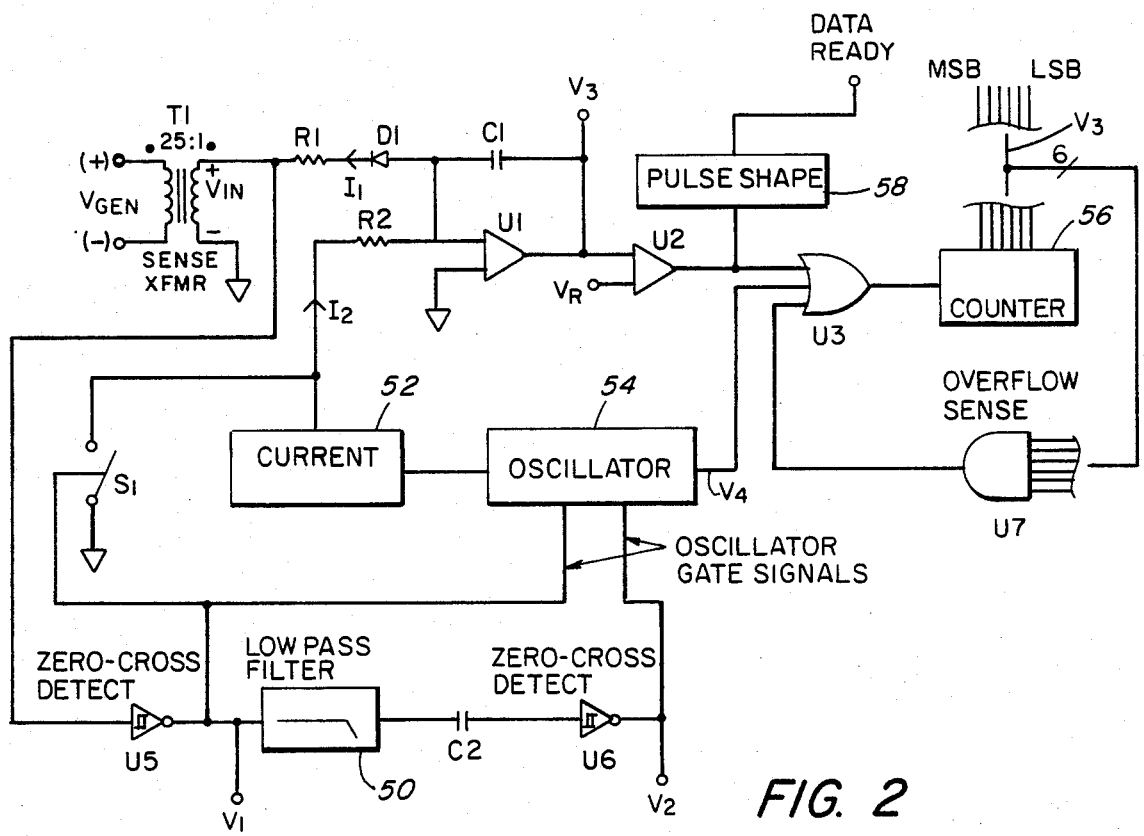
FIG. 2 shows an exemplary sensor for the system of FIG. 1.

FIG. 2 shows an exemplary embodiment of the sensor 20 of FIG. 1, where the signal denoted $V_{GENERATOR}$ corresponds to the output voltage from the generator 12 and the signal denoted $V_s$ corresponds to the digital feedback signal applied to microprocessor 18 (whereas that signal is combined with $V_{IN}$).

In this configuration, the basic timing reference for the system is the generator voltage, $V_{GENERATOR}$. A sense transformer (T1) provides isolation between the high voltage of generator 12 and the control circuitry of sensor 20 attenuating the generator voltage by a factor of 25. The output of the sense transformer is zero-cross detected and shaped into a square wave ($V_1$) by circuit U5. The resultant waveform is integrated (to shift it 90°) by low pass filter 50 and capacitively coupled (by capacitor C2) to an inverter U6. The signal applied to U6 is zero-cross detected, producing a quadrature square wave ($V_2$). The timing relationships are illustrated by the waveforms shown in FIG. 3. Signals $V_1$ and $V_2$ are distributed throughout the system 10 for synchronization. The signal $V_2$ is used to enable and control the updating of capacitive array 16.

Figure 3:
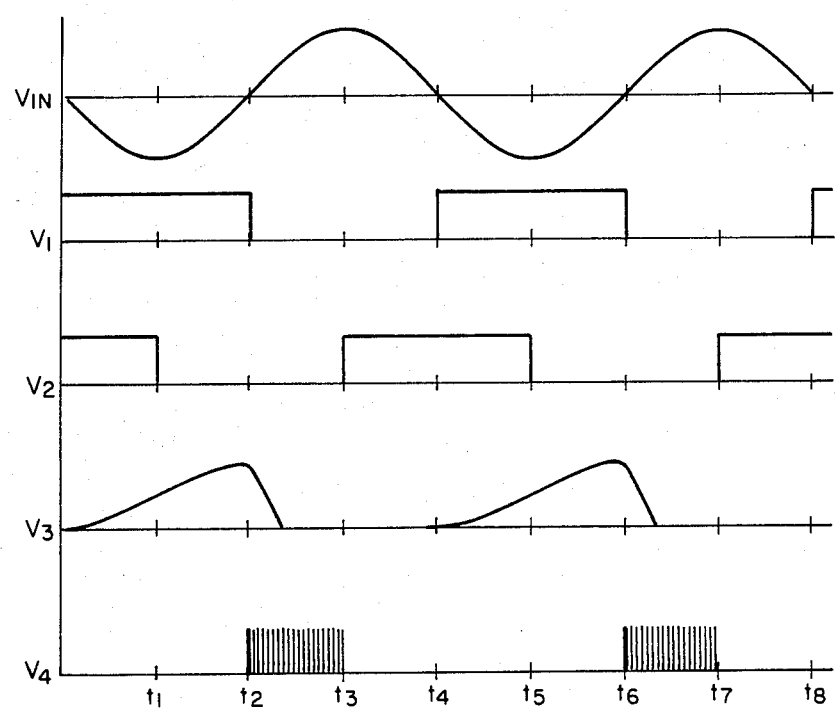
FIG. 3 shows waveforms illustrating the operation of the sensor of FIG. 2.

The operation of a typical conversion cycle is illustrated in the interval $t_4$ to $t_8$ of FIG. 3. The input voltage $V_{IN}$ is coupled from the generator output voltage through a 25:1 step-down transformer (T1). At $t_4$, $V_{IN}$ goes negative, sending $V_1$ high. $D_1$ is biased on and the integrator formed by $R_1$, $C_1$ and $U_1$ acts as an input filter to attenuate noise due to switched loads on the generator output. At $t_6$, $V_{IN}$ goes through zero again, $V_1$ goes low and the input sampling process is complete. Since the generator voltage is given by $$v_{GEN}(t) = V_{GEN} \sin\omega_o t$$

then at $t = t_6$, $$V_3 = \frac{2V_{GEN}}{R_1 C_1 \omega_o}$$

During the input sample period (i.e. from $t_4$ to $t_6$), signal $V_1$ maintains switch $S_1$ closed to shunt current from constant current source 52 (thereby preventing current flow through $R_2$).

At $t = t_6$, $I_1$ goes to zero as $D_1$ back-biases, and oscillator 54 is turned on from $t_6$ until $t_7$. Also, at this time, $S_1$ is opened in response to $V_1$ and the output of comparator $U_2$ is low, thereby enabling gate $U_3$ to pass pulses to a counter 56. The output current $I_2$ of current source 52 now flows through $R_2$ into the integrator ($U_1$, $R_1$, and $C_1$). $V_3$ ramps towards zero at a rate set by $I_2$ and the integrating capacitor $C_1$. When $V_3$ is equal to $V_R$, the output of comparator $U_2$ goes high, driving gate $U_3$ high to prevent any additional oscillator pulses from reaching the counter. The output ($V_o$) of the counter is given as $$N = \omega_c \Delta t$$

where $\omega_c$ is the oscillator frequency, and $\Delta t$ is the time it takes $V_3$ to ramp down to $V_R$. The circuit conversion gain is $$N = \frac{\omega_c C_1}{I_2}\left[\frac{2V_{GEN}}{25R_1 C_1 \omega_o} - V_R\right]$$

which, for $V_R$ close to zero, is approximately $$\frac{2\omega_c}{25 I_2 R_1 \omega_o} V_{GEN}$$

In the present embodiment, $V_R$ is set one diode drop above ground, to avoid problems with the integrator driving to the ground in the single supply system.

Overflow is sensed by a six input nand gate (U7) which drives gate U3 to prevent passage of the oscillator pulse train to the input of counter 56 when the counter fills before V3 ramps down to $V_R$. This prevents the counter from counting modulo 64, which would introduce a change in sign in the loop transmission.

A pulse shaping network 58 is responsive to the rising edge of the signal at the output of U2 to generate a DATA READY signal, indicating that the A/D conversion is completed.

Figure 4:
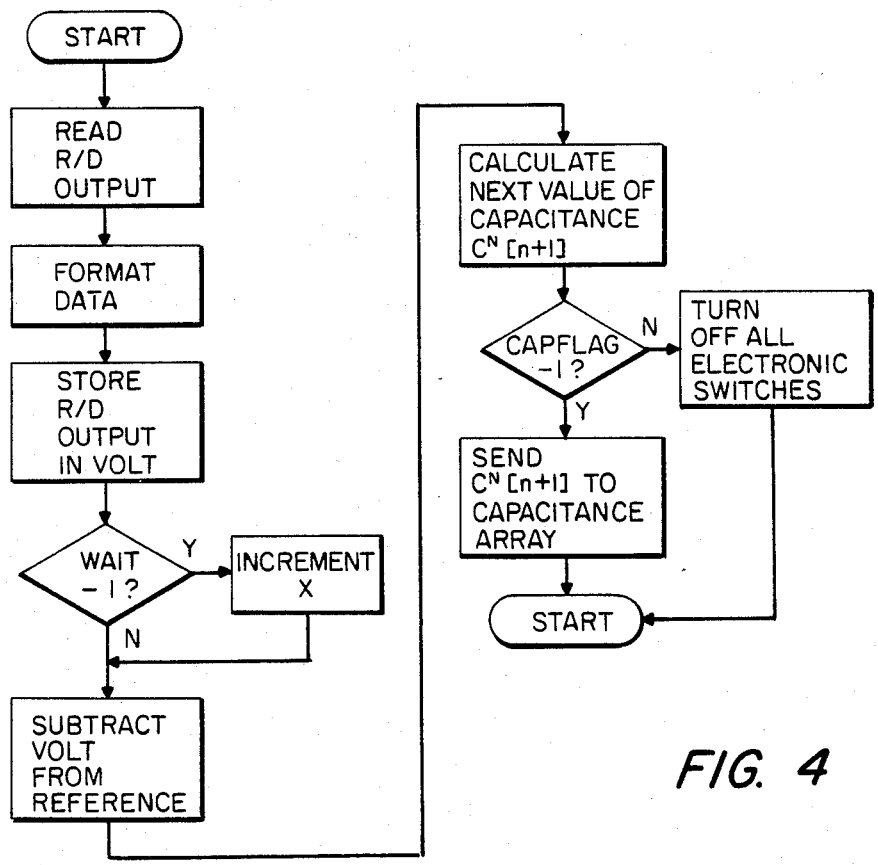
FIG. 4 shows a flowchart illustrating the operation of the microprocessor in the system of FIG. 1.

With this configuration, the integrator itself can be relatively straightforward, and correspondingly inexpensive. Since that integrator is only required to hold an output until the analog-to-digital conversion is performed, there may readily be applied conventional auto-zero functions which correct for long-term drift. There is virtually no memory in the sensor, and the memory in the digital control loop for the exemplary induction generator control system is concentrated all in the forward path, rather than in the feedback path. As a result, the feedback network does not slow down transient response, or add phase lag, and the resultant system lends itself to high gain, stable loop performance. In the illustrated example, microprocessor 18 performs the difference function on the input signal and the signal from the feedback network, and then digitally generates appropriate compensation to be applied to the capacitor array 16. FIG. 4 shows a general flow chart illustrating the microprocessor operation relating to the capacitor selection control.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. A digital feedback control system comprising:
a difference network including means for generating an error signal representative of the difference between an input signal and a sensor signal,
a controlled system responsive to said error signal and including means for generating an output signal representative of the operation of said controlled system, wherein said output signal is a relatively high frequency carrier signal having a relatively slowly varying envelope,
a feedback network responsive to said output signal and including sensor means for generating said sensor signal, said sensor means including:
  A. selectively operative integrator means for generating an integrated signal representative of the integral of said carrier signal,
  B. selectively operative reset means for resetting said integrator,
  C. selectively operative analog-to-digital (A/D) means for generating a digital signal representative of said integrated signal, and
  D. a controller switch operative during each cycle of said carrier signal including control means for sequentially:
    i. enabling said integrator means during a predetermined portion of each cycle,
    ii. enabling said A/D means,
    iii. enabling said reset means,
and said digital signal corresponds to said sensor signal, wherein said controlled system is controlled on a cycle-to-cycle basis.

2. A system according to claim 1 wherein said control means is operative to enable said integrator for a period corresponding to onehalf of each cycle of said carrier signal.

* * * * *